United States Patent [19]
Rees

[11] Patent Number: 5,559,447
[45] Date of Patent: Sep. 24, 1996

[54] OUTPUT BUFFER WITH VARIABLE OUTPUT IMPEDANCE

[75] Inventor: David Rees, Overton, United Kingdom

[73] Assignee: Cypress Semiconductor, San Jose, Calif.

[21] Appl. No.: 341,371

[22] Filed: Nov. 17, 1994

[51] Int. Cl.$^6$ .................. H03K 19/0185; H03K 19/0948
[52] U.S. Cl. .................. 326/30; 326/86; 326/87
[58] Field of Search .................. 326/30, 83, 86–87, 326/121, 21, 17

[56] References Cited

U.S. PATENT DOCUMENTS

| | | | |
|---|---|---|---|
| 5,166,155 | 11/1992 | Kano | 326/87 |
| 5,218,242 | 6/1993 | Imazu et al. | 326/30 |
| 5,239,211 | 8/1993 | Jinbo | 326/83 |
| 5,241,221 | 8/1993 | Fletcher et al. | 326/121 |
| 5,300,828 | 4/1994 | McClure | 326/83 |
| 5,382,847 | 1/1995 | Yasuda | 326/30 |

*Primary Examiner*—Edward P. Westin
*Assistant Examiner*—Jon Santamauro
*Attorney, Agent, or Firm*—Blakely, Sokoloff, Taylor & Zafman

[57] ABSTRACT

An output buffer with a variable output impedance is described. The buffer is designed so that the output impedance is set relatively low during the initial portion of the output transition in which the step would occur. The output impedance is increased near the end of the transmission to approximate the characteristic impedance of a transmission line driven by the buffer. Specifically, a first feedback circuit in the variable impedance output buffer outputs a first control signal in a first state during a first portion of the output transition. The first feedback circuit outputs the first control signal in a second state during a second portion of the output transition after the first portion. A first switched resistive element receives the first control signal from the first feedback circuit. The first switched resistive element increases the output impedance of the buffer in response to the first control single being in the second state. The second portion of the output transition occurs when the buffer output voltage crosses the threshold as the output voltage approaches the end of the output transition.

30 Claims, 7 Drawing Sheets

OUTPUT BUFFER WITH VARIABLE OUTPUT IMPEDANCE

BACKGROUND OF THE INVENTION

1. Field of the Invention

The present invention relates to integrated circuits, and more particularly to improving the output of such circuits during state transitions.

2. Description of the Related Art

The communication of digital signals over wires and cables gives rise to a number of problems. Some of these problems arise when communicating information between printed circuit boards over a backplane, or even over the short distances traversed on a single circuit board. Transmission line effects are one such problem. In fact, in the context of the fastest ECL chips with rise times of less than one nanosecond, these effects are so severe that signal lines of more than one inch must be treated as transmission lines and be properly terminated to avoid impedance mismatch and signal reflection.

Figure 1:
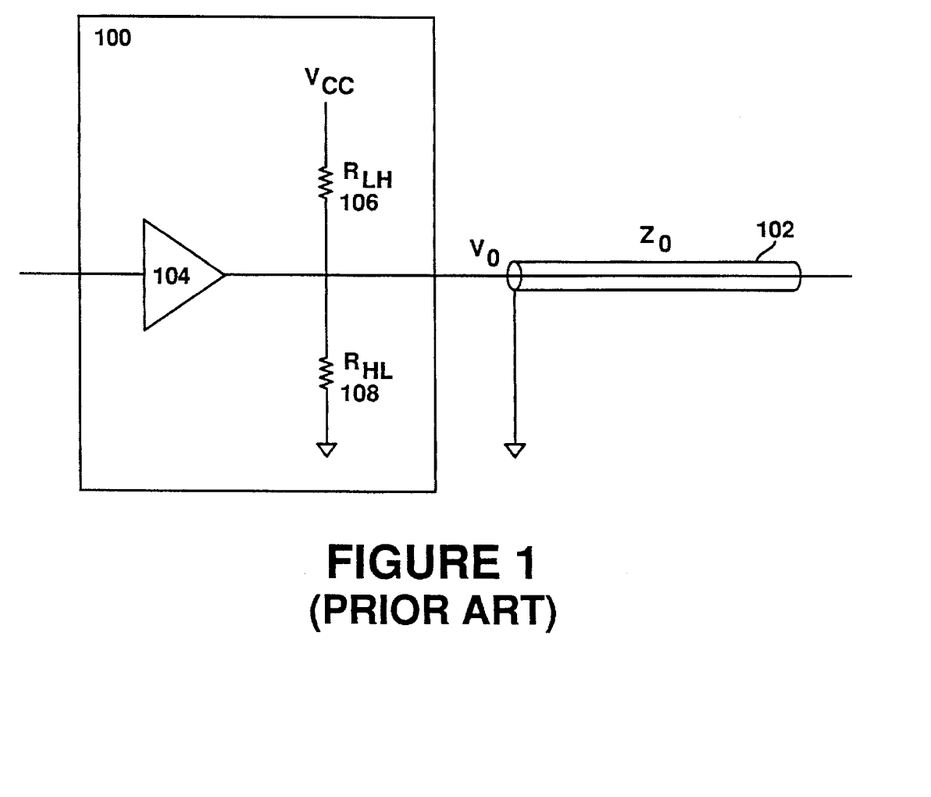
FIG. 1 illustrates an output buffer coupled to a transmission line.

At the output stage of an integrated circuit, an output buffer is typically needed to transfer signals to the signal lines. The term "buffer" may also refer to an entire IC dedicated solely to driving the signal lines. An output buffer 100 coupled to a transmission line 102 is illustrated in FIG. 1. The transmission line has a characteristic impedance $Z_0$. The output buffer 100 includes an ideal buffer 104. The "real world" output buffer 100 exhibits an output impedance $R_{LH}$ 106 when the output undergoes a low-to-high transition, and an output impedance $R_{HL}$ 108 when undergoing a high-to-low transition. These impedances are, for the most part, contributed by pull-up and pull-down transistors at the output stage of the buffer.

Figure 2:
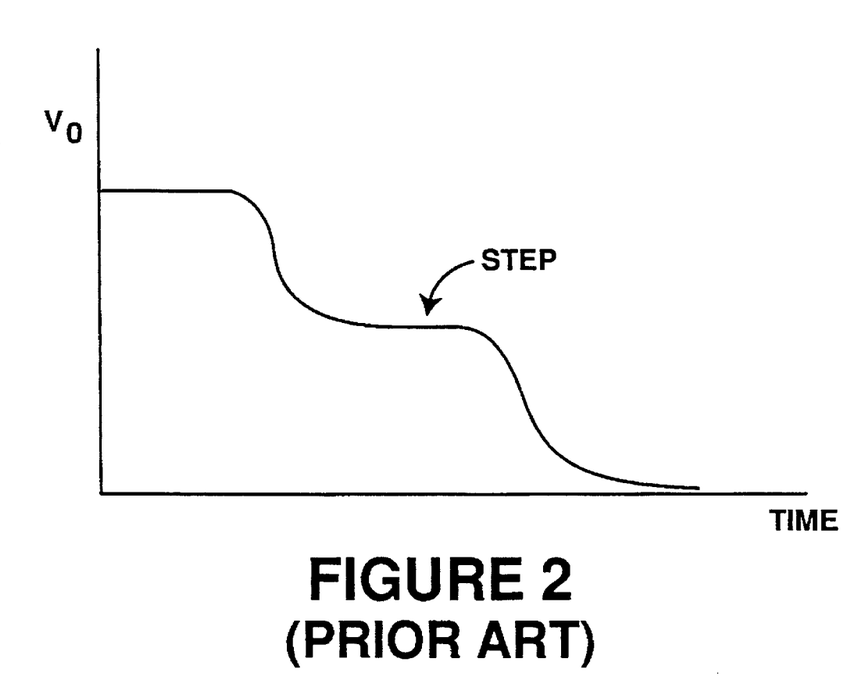
FIG. 2 illustrates the output voltage of an output buffer as it undergoes an output transition from a high state to a low state.

FIG. 2 illustrates the output of the buffer 100 (assumed to be noninverting) as it undergoes a transition from a high state (typically on the order of 3 volts) to a low state (typically 0 volts). It can be seen that a high-to-low input does not necessarily produce a sharp transition at the output. Rather, the output waveform exhibits an intermediate step before falling to the low state. This step is caused by the fact that for a high-to-low transition, the resistor $R_{HL}$ in series with the characteristic impedance $Z_0$ acts as a voltage divider. The height of the step depends on the relative values of $R_{HL}$ and $Z_0$, and the length of the step depends upon the roundtrip electrical delay of the output signal through the transmission line.

The input buffer of another circuit that receives the output waveform may malfunction in response to the step. Further, it is known that the step input into one end of a transmission line may cause an apparent signal skew between the two ends.

The transition step is not the only transmission line effect on the buffer output. As is well-known in the art, if the output impedance of the buffer is not closely matched to the characteristic impedance of the transmission line, then the output waveform will experience undershoot and overshoot, i.e., ringing, when it approaches its final value. On the other hand, if the output impedance is matched to the transmission line impedance during much of the step, then the buffer may not be able to sink or source a sufficient D.C. current if the transmission line is of low impedance or has some form of D.C. termination.

One can thus appreciate the desirability of eliminating both the transition step and impedance mismatch effects caused by the interface of an output buffer with a transmission line.

SUMMARY OF THE INVENTION

The present invention overcomes the disadvantages of the prior art by providing an output buffer with a variable output impedance. The buffer is designed so that the output impedance is set relatively low during the initial portion of the output transition in which the step would occur. The output impedance is increased near the end of the transition to approximate the characteristic impedance of a transmission line driven by the buffer.

Specifically, a first feedback circuit in the variable impedance output buffer outputs a first control signal in a first state during a first portion of the output transition. The first feedback circuit outputs the first control signal in a second state during a second portion of the output transition after the first portion. A first switched resistive element receives the first control signal from the first feedback circuit. The first switched resistive element increases the output impedance of the buffer in response to the first control single being in the second state. The second portion of the output transition occurs when the buffer output voltage crosses a predetermined threshold as the output voltage approaches the end of the output transition.

In one embodiment, the first switched resistive element includes a first resistor that is switched in series with the buffer output in response to the first control signal being in the second state, thereby increasing the output impedance of the buffer. In another embodiment, the buffer includes an output stage having a first pull-up transistor and a first pull-down transistor. The first pull-up transistor selectively couples the output to a high-level voltage, and the first pull-down transistor selectively couples the output to a low-level voltage. To control the output impedance during a high-to-low (low-to-high) output transition, a second pull-down (pull-up) transistor is switchably coupled in parallel with the first pull-down (pull-up) transistor when the first control signal is in the first state. The second pull-down (pull-up) transistor is uncoupled from the first pull-down (pull-up) transistor when the first control signal is in the second state to thereby increase the buffer output impedance.

BRIEF DESCRIPTION OF THE DRAWINGS

The objects, features and advantages of the present invention will be apparent to one skilled in the art in light of the following detailed description in which.

DETAILED DESCRIPTION OF THE INVENTION

The present invention provides an output buffer with a variable output impedance, and a related method. For purposes of explanation, specific details are set forth to provide a thorough understanding of the present invention. However, it will be understood by one skilled in the art, from reading this disclosure, that the invention may be practiced without these details. Moreover, well-known elements, devices, process steps and the like are not set forth in order to avoid obscuring the invention.

The present invention achieves both a reduction in the step height and a reduction in impedance mismatch at the output of the output buffer. The variable impedance output buffer of the present invention does not generally achieve these two objectives simultaneously, however. If the output impedance were matched to $Z_0$ during the step portion of the output waveform, then the step height would lie near the mid-range of the output voltage. This effect results in an indeterminate logic level during the duration of the step. Any input buffers or other logic receiving the output waveform would oscillate about the high and low states. This indeterminate level is a particular problem for clock inputs because false triggering can occur.

Figure 3:
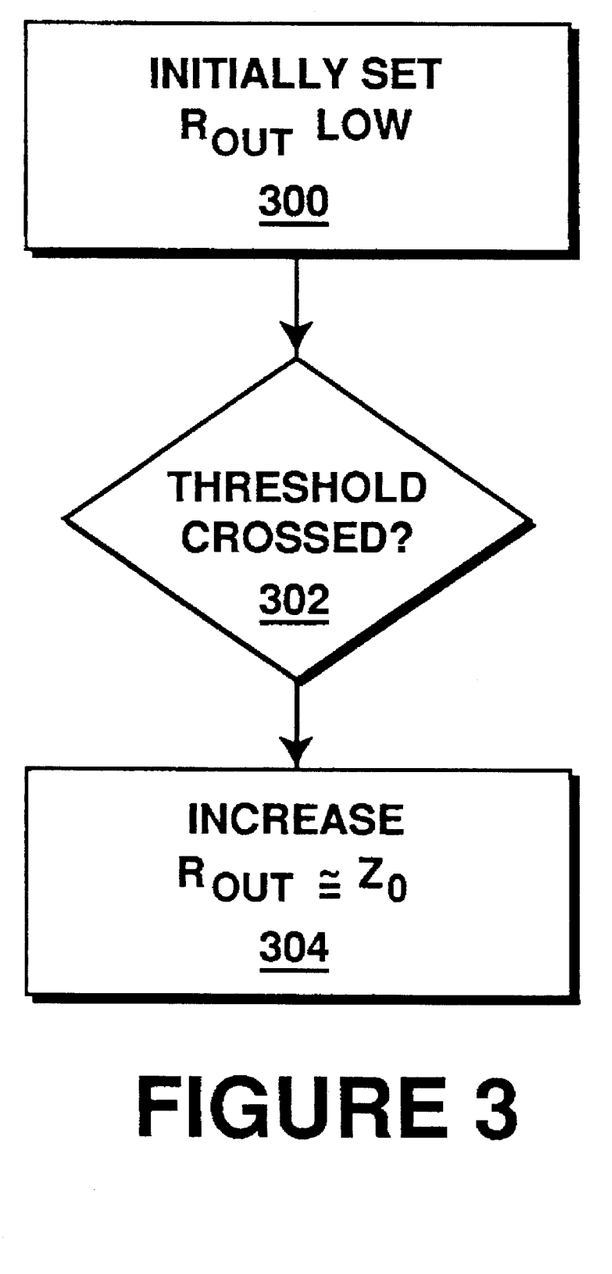
FIG. 3 is a flow chart diagramming the process of the present invention.

Accordingly, the present invention operates as follows to avoid these problems. Referring to FIG. 3, the variable impedance output buffer of the present invention is designed so that the output impedance is set relatively low during the initial portion of the state transition (step 300). This action controls the step size. Those skilled in the art will understand that the output impedance may be made relatively small through the use of low-impedance components at the buffer output stage.

At some time, feedback circuitry in the buffer determines whether the transition has passed a predetermined threshold (step 302). For example, for a falling edge, the feedback circuitry determines whether the output voltage has fallen below a predetermined low threshold. Conversely, for a rising edge, the feedback circuitry determines whether the output voltage has exceeded a predetermined high threshold. After the threshold is passed, the feedback circuitry causes the output buffer to increase its output impedance to a value relatively close to that of the characteristic impedance of the transmission line to which the output buffer is to be connected (step 304). This action reduces impedance mismatch effects.

Figure 4:
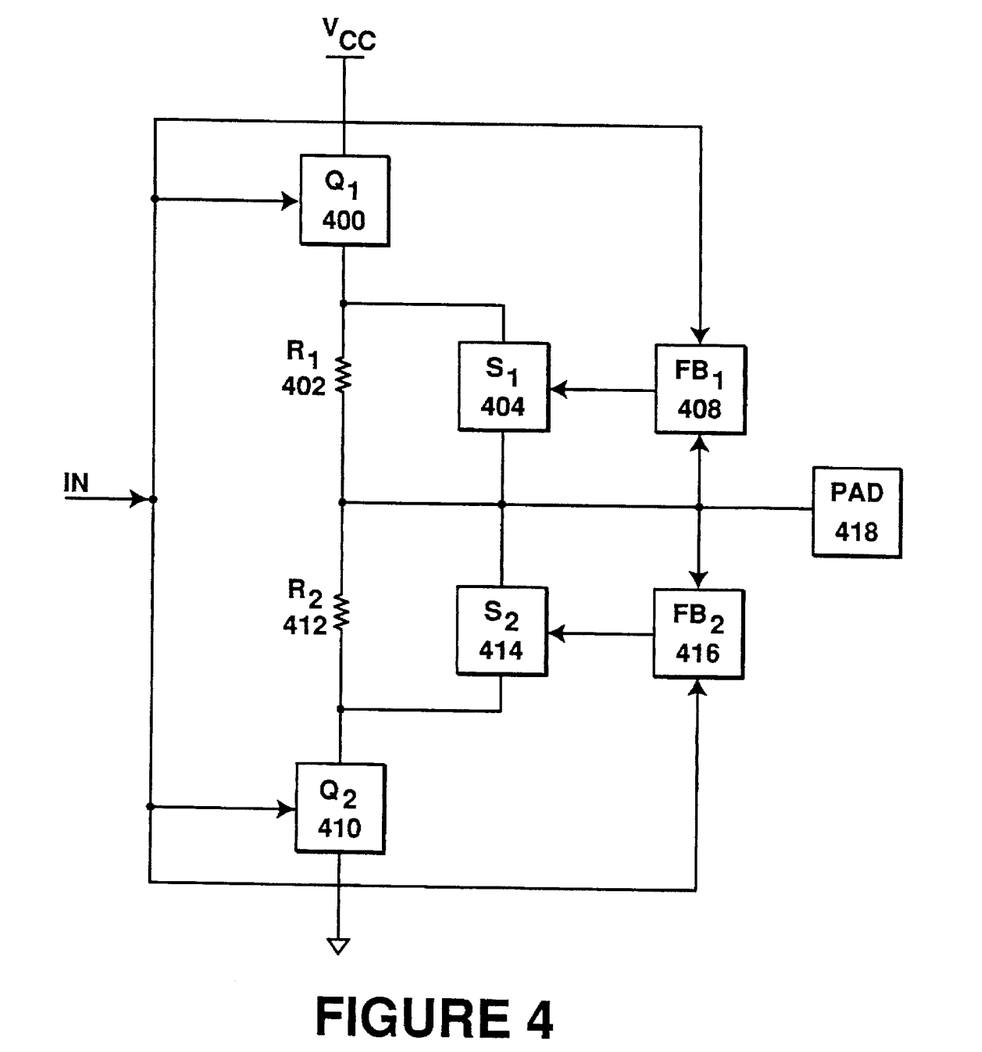
FIG. 4 illustrates an embodiment of the variable impedance output buffer of the present invention.

FIG. 4 illustrates an embodiment of the variable impedance output buffer of the present invention. To simplify the analysis, the buffer is realized as a noninverting buffer, although those skilled in the art will understand that the buffer may easily be implemented as an inverting buffer. The buffer includes a pull-up transistor $Q_1$ 400 that is connected in series to a first matching resistor $R_1$ 402. The first matching resistor 402 may be selectively shorted by a first shorting switch $S_1$ 404 under control of a first feedback circuit 408.

A pull-down transistor $Q_2$ 410 is connected in series to a second matching resistor $R_2$ 412. A second shorting switch $S_2$ 414 selectively shorts the second matching resistor $R_2$ 412 under control of a second feedback circuit 416.

The variable impedance buffer operates as follows. The buffer will first be described with respect to a high-to-low transition at its output. Because it is assumed that the buffer is a non-inverting buffer, the input must also be a high-to-low transition. Before the transition, the pull-up transistor $Q_1$ 400 is turned on to conduct so that the output measured at a pad 418 of the buffer chip is high. Conversely, the pull-down transistor $Q_2$ 410 is turned off. In response to the input and the pad output being high, the first feedback circuit 408 causes the first shorting switch $S_1$ 404 to be open so that the first matching resistor $R_1$ 402 is in series with $Q_1$ 400. Conversely, under those conditions, the second feedback circuit 416 keeps the second shorting switch 414 closed to short out the second matching resistor 412.

As the input begins its low-going transition, the pull-up transistor $Q_1$ 400 begins to turn off and the pull-down transistor $Q_2$ 410 begins to turn on so as to begin pulling the output at the pad 418 down. A low threshold is predefined in the second feedback circuit 416. In response to a falling input and the output voltage falling below the low threshold, the first feedback circuit 408 shorts $R_1$ 402. Further, the second feedback circuit 416 opens the second shorting switch 414 so that the second matching resistor $R_2$ 412 is added in series to the impedance of the pull-down transistor $Q_2$ 410 measured at the output pad 418. In this manner, it can be seen that during the initial high portion of the low-going transition, the output impedance is relatively low, while at some point during the transition to the low state, the output impedance is increased through the addition of the second matching resistor $R_2$ 412. If the characteristic impedance of the transmission line that will be driven by the output buffer is known in an advance, the second matching resistor $R_2$ 412 can be selected so that the total output impedance including that resistance matches the transmission line impedance. In general, however, this information will not be known, but the relative increase in impedance during the end of the transition will result in an improvement in performance and a reduction in noise.

The operation of the buffer circuit of FIG. 4 for a low-to-high output transition will now be described. Recall that at the end of the high-to-low transition, the second matching resistor $R_2$ 412 is seen at the output because the second shorting switch $S_2$ 414 is open. However, as the input begins its high-going transition, the second feedback circuit 416 will respond to the high-going input by closing the second shorting switch 414 even before the output waveform at the pad 418 has gone high.

As the input goes high, the pull-down transistor $Q_2$ 410 begins to turn off and the pull-up transistor $Q_1$ 400 begins to turn on so as to pull the output voltage at the pad 418 up. A high threshold is predefined in the first feedback circuit 408. In response to the rising input and the output voltage at the pad 418 exceeding the high threshold, the first feedback circuit 408 causes the first shorting switch $S_1$ 404 to open so that the first matching resistor $R_1$ 402 is added in series to the impedance of the pull-up transistor $Q_1$ 400 as seen from the output pad 418. Consequently, during the initial portion of the high-going transition, the output impedance is relatively low compared to the impedance during the final portion of the transition. As before, if the characteristic impedance of the transmission line to be driven by the output buffer is known in advance, then the first matching resistor $R_1$ 402 can be selected so that the total output impedance during the final stage of the high-going transition matches the transmission line impedance.

Figure 5:
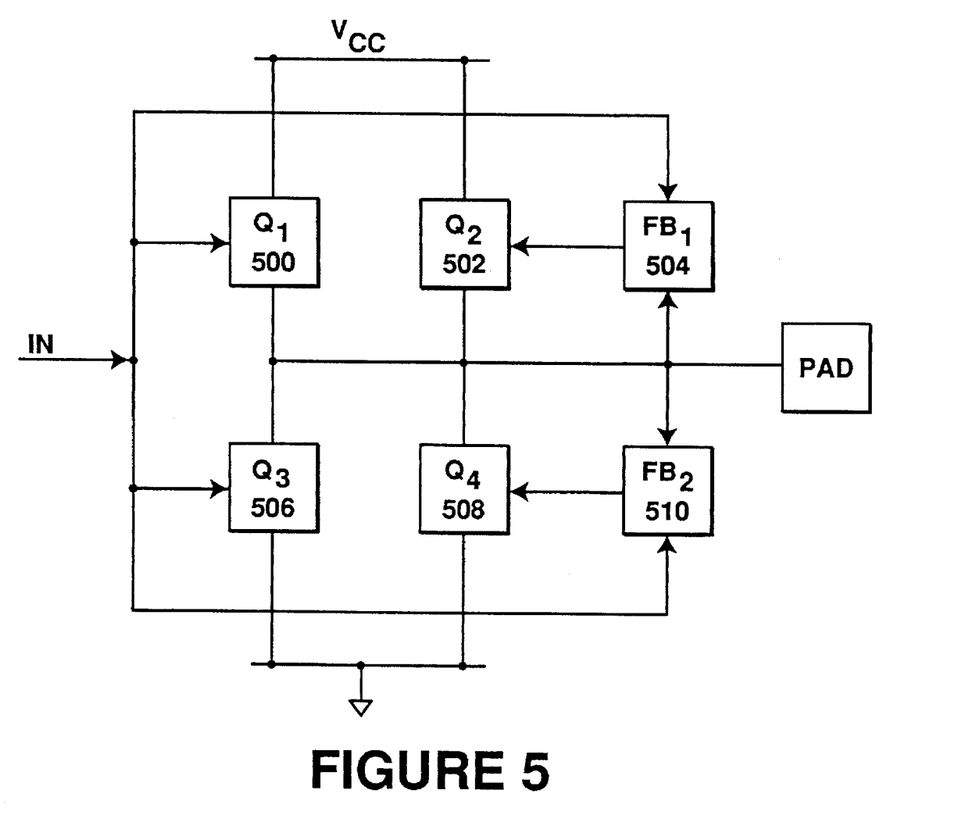
FIG. 5 illustrates an alternative embodiment of the variable impedance output buffer of the present invention.

An alternative embodiment of the variable impedance output buffer is illustrated in FIG. 5. The circuit includes a first pull-up transistor $Q_1$ 500 connected in parallel to a second pull-up transistor $Q_2$ 502. The switching of the second pull-up transistor 502 is controlled by a first feedback circuit 504. On the pull-down down side of the buffer circuit, a first pull-down transistor $Q_3$ 506 is connected in parallel to a second pull-down transistor $Q_4$ 508, which is controlled by a second feedback circuit 510. The output impedance of this buffer circuit is a reflection of the combination of the impedances of the parallel pairs of pull-up and pull-down transistors.

This circuit operates in much the same manner as that of FIG. 4, except that in response to the feedback signal nearing the end of a transition, a transistor switch in a corresponding pair is opened so as to remove its resistance from the parallel pair. This has the effect of increasing the output impedance of the buffer circuit. For example, near the end of a high-going transition, the first feedback circuit 504 turns the second pull-up transistor $Q_2$ 502 off to remove its resistance from the parallel pair of $Q_1$ 500 and $Q_2$ 502, thereby increasing the output impedance. For a low-going transition, the second feedback circuit 510 turns the second pull-down transistor $Q_4$ 508 off to remove its resistance from the parallel pair $Q_3$ 506 and $Q_4$ 508 to increase the output impedance during the end of the high-to-low transition period.

The buffer circuits of FIGS. 4 and 5 allow the output impedances to be varied for both falling and rising edges. In practice however, output buffers may be used in applications where varying the impedance is only needed for one type of transition. For example, if the ringing at the end of the transition from low to high is unlikely to cause an input buffer receiving the transition to trigger falsely because the input buffer's triggering threshold is sufficiently far from the steady state level, then impedance matching for this transition is unnecessary. In those cases, as shown below, only the appropriate components need to be included in the buffer circuit.

Figure 6:
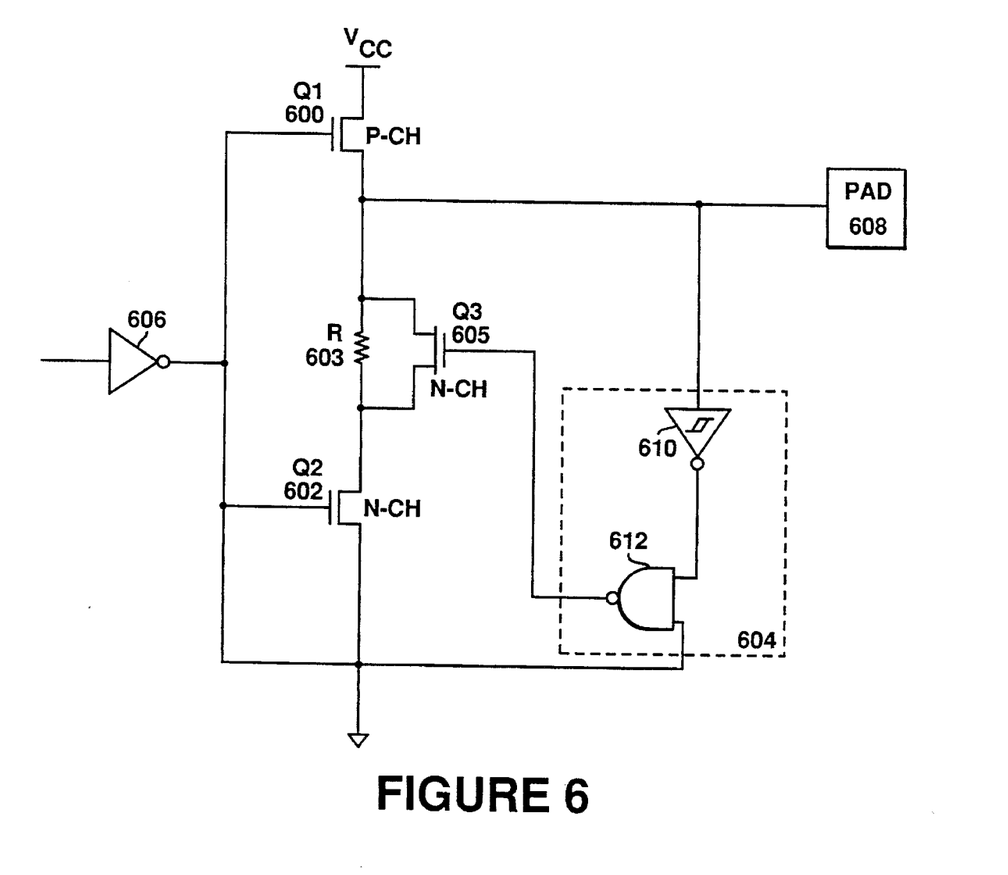
FIG. 6 is a circuit diagram illustrating an embodiment of a single-edge triggered, variable impedance output buffer of the present invention.

A detailed circuit diagram for a single-edge triggered, variable impedance output buffer is illustrated in FIG. 6. The circuit of FIG. 6 is an embodiment of the portion of the circuit of FIG. 4 that varies the impedance for a high-to-low transition. The circuit includes a pull-up transistor $Q_1$ 600, a pull-down transistor $Q_2$ 602, a matching resistor 603, a feedback circuit 604, and a shorting transistor switch $Q_3$ 605. The matching resistor 603 and the shorting switch $Q_3$ 605 may together be considered a switched resistive element. Further, those skilled in the art will recognize that the pull-up and pull-down transistors disclosed herein are generally found at the output stage of an output buffer and that other circuitry may be included between the input of the buffer and the pull-up and pull-down transistors without loss of generality and without affecting the applicability of the present invention.

In the embodiment shown in FIG. 6, the pull-up transistor $Q_1$ 600 is preferably a P-channel MOSFET, which turns on in response to a low gate voltage. Conversely, the pull-down transistor $Q_2$ 602 is preferably an N-channel MOSFET, which turns on in response to a high gate voltage. Those skilled in the art will recognize that all transistors described in this disclosure need not be implemented in MOS technology, but may be implemented in other technologies such as bipolar. Further, those skilled in the art will recognize that the present invention as described herein may easily be modified to accommodate switching transistors of any polarity.

An inverter 606 is coupled at the input of the buffer to make it a non-inverting buffer so that the output at a pad 608 tracks the input waveform. As suggested above, the input inverter may be omitted so that the output buffer acts as an inverting buffer.

The feedback circuit 604 receives at its inputs the inverted input voltage from the input inverter 606 and the output voltage measured at the pad 608. The output voltage passes through an inverter, preferably a Schmitt trigger inverter 610, to one input of a NAND gate 612. The other input of the NAND gate receives the inverted input voltage. The output of the NAND gate 612 controls the gate of the shorting switch $Q_3$ 603, which is preferably implemented as an N-channel MOSFET.

The output buffer of FIG. 6 operates in response to a low-going transition as follows. When the input is high, the output of the inverter 606 is low. This state turns the pull-up transistor $Q_1$ 600 on, and the pull-down transistor $Q_2$ 602 off. As a result, the output measured at pad 608 is high. This value passes through the inverter 610 as a low value to the input of the NAND gate 612. The other input of the NAND gate is also low, resulting in a high output of the NAND gate 612. This value causes the shorting switch $Q_3$ 614 to conduct to thereby short out the resistor 603.

When the input makes a transition from high to low, this is reflected at the output of the inverter 606 as a low-to-high transition. The high input value is seen at one input of the NAND gate 612. During this transition, the pull-up transistor $Q_1$ 600 begins to turn off, and the pull-down transistor $Q_2$ 602 begins to turn on to pull down the output voltage measured at the pad 608. When the output voltage falls below a predetermined threshold for a low-going edge, the Schmitt trigger changes state to a high value. This value, in combination with the high value at the other input, causes the NAND gate 612 output to go low. This low value opens the shorting switch $Q_3$ 614 to thereby add the resistor 603 in series with the impedance of the pull-down transistor $Q_2$ 602. Consequently, the output impedance during the initial portion of the low-going edge is relatively low, while the output impedance increases when the output voltage falls below a predetermined threshold. This threshold may be adjusted by adjusting the triggering threshold of the Schmitt trigger inverter 610. The adjustment of a Schmitt trigger threshold is well known in the art.

The operation of the buffer-circuit of FIG. 6 in response to an input rising edge will now be described. During a high-going transition, the rising edge results in a falling edge at the output of the inverter 606. This voltage drop is first detected at the corresponding NAND gate 612 input. This forces the output of the NAND gate 612 high, which closes the switch $Q_3$ 614 to again short the resistor R 603. Thus, at the start of the next low-going transition, the output impedance associated with the pull-down transistor $Q_2$ 602 will be at its minimum value.

The circuit of FIG. 6 varies the output impedance for a low-going edge. Based upon this circuit and the description of the invention given herein, those skilled in the art will be able to make the modifications necessary to build an analogous variable impedance buffer that increases its output impedance at the end of a low-to-high transition at the output. Further, those skilled in the art will understand how to combine those two circuits to implement the circuit of FIG. 4, which is responsive to both edges.

Figure 7:
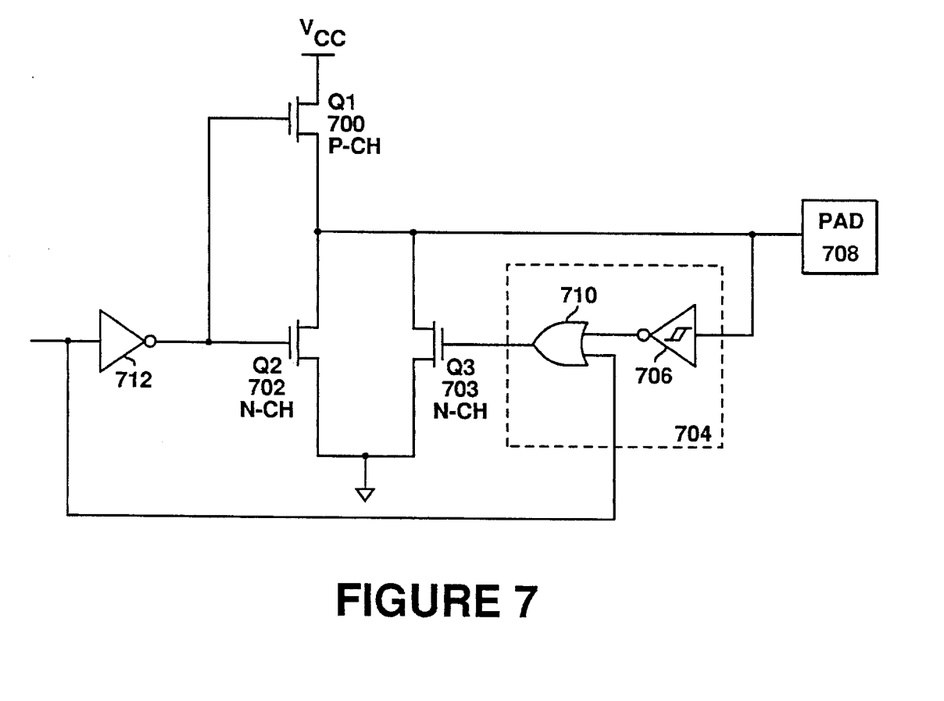
FIG. 7 is a circuit diagram illustrating an alternative embodiment of a single-edge triggered, variable impedance output buffer of the present invention.

Another embodiment of a single-edge triggered, variable impedance output buffer for a low-going transition is illustrated in FIG. 7. Rather than switching in a series resistance at the end of the transition, this circuit switches out a parallel impedance at that time. This circuit includes a pull-up transistor $Q_1$ 700, and a first pull-down transistor $Q_2$ 702 in parallel with a second pull-down transistor $Q_3$ 703. A feedback circuit 704 includes a Schmitt trigger inverter 706 that provides an inverted output voltage measured at a pad 708 to a NOR gate 710. The other input of the NOR gate 710 receives the same input as an inverter 712. The inverter 712 is included so that the output at the pad 708 tracks the input of the output buffer.

The variable impedance buffer works in a manner similar to that of the buffer of FIG. 6. However, rather than switching in a resistance at the end of the transition, the buffer of FIG. 7 switches the parallel pull-down transistor $Q_3$ 703 off to eliminate its resistance from being seen at the output pad 708. The removal of this parallel resistance increases the output impedance of the buffer.

Specifically, when the input and the output at pad 708 are initially high, $Q_3$ 703 is off to avoid shorting the output to ground. As the input goes low, the NOR gate 710 causes $Q_3$ 703 to turn on to help pull down the output. As the output goes low and passes the Schmitt trigger 706 threshold, the NOR gate 710 again causes $Q_3$ 703 to turn off at the end of the transition in order to increase the output impedance.

As with the circuit of FIG. 6, those skilled in the art will understand how to modify the circuit of FIG. 7 to account for a low-to-high transition, and will understand how to combine the circuits for both a rising edge and a falling edge to realize the circuit of FIG. 5.

It will be appreciated that various modifications and alterations might be made by those skilled in the art without departing from the spirit and scope of the present invention. In particular, each resistive element described herein as a resistor may instead be implemented using a transistor in an on state to create an effective resistance, e.g., across the source and drain of an N-channel MOSFET having its gate tied to $V_{CC}$. The invention should, therefore, be measured in terms of the claims which follow.

What is claimed is:

1. A variable impedance output buffer having an input for receiving an input signal and an output for outputting an output signal, wherein the output signal undergoes a transition in response to a transition in the input signal, and the buffer has an output impedance, the output buffer comprising:

a first feedback circuit for outputting a first control signal in a first state during a first portion of the output transition, and for outputting the first control signal in a second state during a second portion of the output transition after the first portion; transition, and for outputting the first control signal in a second state during a second portion of the output transition after the first portion, wherein said first feedback circuit includes a Schmitt trigger inverter; and a first switched resistive element, coupled to receive the first control signal from the first feedback circuit, for increasing the output impedance of the buffer in response to the first control signal being in the second state.

2. The buffer of claim 1, wherein the second portion of the output transition occurs when a buffer output voltage crosses a predetermined threshold as the output voltage approaches the end of the output transition.

3. The buffer of claim 2, wherein the second portion of the output transition occurs when the output voltage exceeds a predetermined high threshold voltage during a low-to-high output transition.

4. The buffer of claim 2, wherein the second portion of the output transition occurs when the output voltage falls below a predetermined low threshold voltage during a high-to-low output transition.

5. The buffer of claim 1, wherein in response to a low-to-high transition, the first feedback circuit outputs the first control signal in the second state when the output voltage exceeds a predetermined high threshold voltage, the buffer further comprising:

a second feedback circuit for outputting a second control signal in a third state during a first portion of a high-to-low output transition, and for outputting the second control signal in a fourth state when the output voltage during the high-to-low transition falls below a predetermined low threshold voltage; and a second switched resistive element, coupled to receive the second control signal from the second feedback circuit, for increasing the output impedance of the buffer in response to the control signal being in the fourth state.

6. The buffer of claim 1, wherein the first switched resistive element includes a first resistor that is switched in series with the buffer output in response to the first control signal being in the second state to thereby increase the output impedance of the buffer.

7. The buffer of claim 6, further comprising:

an output stage having a pull-up transistor and a pull-down transistor, the pull-down transistor for selectively coupling a low-level voltage to the output through the first resistor.

8. The buffer of claim 6, further comprising:

an output stage having a pull-up transistor and a pull-down transistor, the pull-up transistor for selectively coupling a high-level voltage to the output through the first resistor.

9. The buffer of claim 1, further comprising:

an output stage having a pull-up transistor and a first pull-down transistor, the first pull-down transistor for selectively coupling the output to a low-level voltage; and a second pull-down transistor that is switchably coupled in parallel with the first pull-down transistor when the first control signal is in the first state during a high-to-low output transition, and uncoupled from the first pull-down transistor when the first control signal is in the second state during a high-to-low output transition to thereby increase the buffer output impedance.

10. The buffer of claim 1, further comprising:

an output stage having a first pull-up transistor and a pull-down transistor, the first pull-up transistor for selectively coupling the output to a high-level voltage; and a second pull-up transistor that is switchably coupled in parallel with the first pull-up transistor when the first control signal is in the first state during a low-to-high output transition, and uncoupled from the first pull-up transistor when the first control signal is in the second state during a low-to-high output transition to thereby increase the buffer output impedance.

11. The buffer of claim 1, the buffer output being coupled to a transmission line having a characteristic impedance, wherein, in response to the first control signal being in the second state, the first switched resistive element increases the output buffer impedance to approximate the characteristic impedance of the transmission line.

12. A variable impedance output buffer having an input for receiving an input signal and an output for outputting an output signal, wherein the output signal undergoes a transition in response to a transition in the input signal, and the buffer has an output impedance, the output buffer comprising:

an output stage having a first pull-up transistor and a first pull-down transistor, the first pull-down transistor for selectively coupling the output to a low-level voltage, the first pull-up transistor for selectively coupling the output to a high-level voltage;

a first feedback circuit for outputting a first control signal in a first state during a first portion of the output transition, and for outputting the first control signal in a second state during a second portion of the output transition after the first portion, wherein said first feedback circuit includes a Schmitt trigger inverter; and a first switched resistive element, coupled to the one of the first pull-up transistor or the first pull-down transistor, for increasing the output impedance of the buffer in response to the first control signal being in the second state.

13. The buffer of claim 12, wherein the second portion of the output transition occurs when a buffer output voltage crosses a predetermined threshold as the output voltage approaches the end of the output transition.

14. The buffer of claim 13, wherein the second portion of the output transition occurs when the output voltage exceeds a predetermined high threshold voltage during a low-to-high output transition.

15. The buffer of claim 13, wherein the second portion of the output transition occurs when the output voltage falls below a predetermined low threshold voltage during a high-to-low output transition.

16. The buffer of claim 12, wherein the first feedback circuit is coupled to the first pull-up transistor, and, in response to a low-to-high transition, the first feedback circuit outputs the first control signal in the second state when the output voltage exceeds a predetermined high threshold voltage, the buffer further comprising:

a second feedback circuit for outputting a second control signal in a third state during a first portion of a high-to-low output transition, and for outputting the second control signal in a fourth state when the output voltage during the high-to-low transition falls below a predetermined low threshold voltage; and a second switched resistive element, coupled to the first pull-down transistor, for increasing the output impedance of the buffer in response to the control signal being in the fourth state.

17. The buffer of claim 12, wherein the first switched resistive element includes a first resistor that is switched in series with the buffer output in response to the first control signal being in the second state to thereby increase the output impedance of the buffer.

18. The buffer of claim 17, the first switched resistive element being coupled in series between the first pull-down transistor and the output, wherein the first resistor is shorted during the first state, and switched in series between the first pull-down transistor and the output during the second state.

19. The buffer of claim 17, the first switched resistive element being coupled in series between the first pull-up transistor and the output, wherein the first resistor is shorted during the first state, and switched in series between the first pull-up transistor and the output during the second state.

20. The buffer of claim 12, further comprising:

a second pull-down transistor that is switchably coupled in parallel with the first pull-down transistor when the first control signal is in the first state during a high-to-low output transition, and uncoupled from the first pull-down transistor when the first control signal is in the second state during a high-to-low output transition to thereby increase the buffer output impedance.

21. The buffer of claim 12, further comprising:

a second pull-up transistor that is switchably coupled in parallel with the first pull-up transistor when the first control signal is in the first state during a low-to-high output transition, and uncoupled from the first pull-up transistor when the first control signal is in the second state during a low-to-high output transition to thereby increase the buffer output impedance.

22. The buffer of claim 12, the buffer output being coupled to a transmission line having a characteristic impedance, wherein, in response to the first control signal being in the second state, the first switched resistive element increases the output buffer impedance to approximate the characteristic impedance of the transmission line.

23. In an output buffer having an input for receiving an input signal and an output for outputting an output signal, wherein the output signal undergoes a transition in response to a transition in the input signal, and the buffer has an output impedance, a method for varying the output impedance of the output buffer comprising the steps of:

(a) outputting a first control signal in a first state during a first portion of the output transition;

(b) outputting the first control signal in a second state during a second portion of the output transition after the first portion, wherein a change from the first portion to the second portion of the output transition is based on a predetermined value; and (c) increasing the output impedance of the buffer in response to the first control signal being in the second state.

24. The method of claim 23, step (c) including the step of detecting the second portion of the output transition when a buffer output voltage crosses a predetermined threshold as the output voltage approaches the end of the output transition.

25. The method of claim 24, the detecting step including the step of detecting the second portion of the output transition when the output voltage exceeds a predetermined high threshold voltage during a low-to-high output transition.

26. The method of claim 24, the detecting step including the step of detecting the second portion of the output transition when the output voltage falls below a predetermined low threshold voltage during a high-to-low output transition.

27. The method of claim 23, step (c) comprising the step of switching a first resistor in series with the buffer output in response to the first control signal being in the second state to thereby increase the output impedance of the buffer.

28. The method of claim 23, the buffer further comprising an output stage having a pull-up transistor and a first pull-down transistor, the first pull-down transistor for selectively coupling the output to a low-level voltage, step (a) comprising the step of switchably coupling a second pull-down transistor in parallel with the first pull-down transistor when the first control signal is in the first state during a high-to-low output transition; and step (c) comprising the step of uncoupling the second pull-down transistor from the first pull-down transistor when the first control signal is in the second state during a high-to-low output transition.

29. The method of claim 23, the buffer further comprising an output stage having a first pull-up transistor and a pull-down transistor, the first pull-up transistor for selectively coupling the output to a high-level voltage, step (a) comprising the step of switchably coupling a second pull-up transistor in parallel with the first pull-up transistor when the first control signal is in the first state during a low-to-high output transition; and step (c) comprising the step of uncoupling the second pull-up transistor from the first pull-up transistor when the first control signal is in the second state during a low-to-high output transition.

30. The method of claim 23, the buffer output being coupled to a transmission line having a characteristic impedance, step (c) comprising the step of:

increasing the output buffer impedance to approximate the characteristic impedance of the transmission line when the first control signal is in the second state.

* * * * *